United States Patent
Nodera et al.

(10) Patent No.: US 9,733,505 B2
(45) Date of Patent: Aug. 15, 2017

(54) LIQUID CRYSTAL PANEL AND METHOD OF FORMING GROOVE IN INSULATING FILM

(71) Applicant: Sakai Display Products Corporation, Sakai-shi, Osaka (JP)

(72) Inventors: Nobutake Nodera, Sakai (JP); Ryo Murata, Sakai (JP); Kazuki Nakao, Sakai (JP); Takahiro Takatsu, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 14/892,794

(22) PCT Filed: May 29, 2014

(86) PCT No.: PCT/JP2014/064323
§ 371 (c)(1),
(2) Date: Nov. 20, 2015

(87) PCT Pub. No.: WO2014/199839
PCT Pub. Date: Dec. 18, 2014

(65) Prior Publication Data
US 2016/0109747 A1  Apr. 21, 2016

(30) Foreign Application Priority Data

Jun. 11, 2013 (JP) .................................. 2013-123040

(51) Int. Cl.
*G02F 1/1333* (2006.01)
*G02F 1/1339* (2006.01)
(Continued)

(52) U.S. Cl.
CPC ...... *G02F 1/133345* (2013.01); *G02F 1/1339* (2013.01); *H01L 27/1262* (2013.01);
(Continued)

(58) Field of Classification Search
None
See application file for complete search history.

(56) References Cited

U.S. PATENT DOCUMENTS 6,157,428 A * 12/2000 Koma ............... G02F 1/133345
349/123
2008/0137022 A1* 6/2008 Komeno ............... G02F 1/1337
349/153
(Continued)

FOREIGN PATENT DOCUMENTS

JP  2008-145461 A   6/2008
JP     4916461 A    7/2008
(Continued)

*Primary Examiner* — Ryan Crockett
(74) *Attorney, Agent, or Firm* — Bret E. Field; Bozicevic, Field & Francis LLP

(57) ABSTRACT

A liquid crystal layer is disposed on a second glass substrate side between a first glass substrate and the second glass substrate, a first insulating film and a second insulating film are formed in this order on a surface of the first glass substrate on the liquid crystal layer side, the outer edge portion of the liquid crystal layer is surrounded by a sealing material, and a plurality of TFTs are insulated from each other by the first insulating film and the second insulating film. A gate insulating film included in the second insulating film is so formed as to have a higher barrier property for gas and/or liquid than the first insulating film, and a groove having a bottom formed with the same material as a part of the material for forming the TFT is formed at a part or the whole of a peripheral edge portion of the second insulating film which is located more inside than a position at which the second insulating film overlaps the sealing material.

7 Claims, 4 Drawing Sheets

(51) Int. Cl.
  *H01L 27/12*     (2006.01)
  *H01L 29/417*    (2006.01)
(52) U.S. Cl.
  CPC ........... *H01L 29/41733* (2013.01); *G02F 2001/133388* (2013.01); *G02F 2201/501* (2013.01)

(56) References Cited

U.S. PATENT DOCUMENTS

2013/0021553 A1* 1/2013 Satoh ................ G02F 1/136227
                                                         349/43
2014/0009706 A1* 1/2014 Moriguchi ............ G02F 1/1339
                                                         349/42
2015/0346535 A1* 12/2015 Moriwaki ......... G02F 1/133345
                                                         349/43

FOREIGN PATENT DOCUMENTS

WO    WO2012132953 A1    10/2012
WO    WO2013011601 A1    1/2013

\* cited by examiner

LIQUID CRYSTAL PANEL AND METHOD OF FORMING GROOVE IN INSULATING FILM

CROSS-REFERENCE TO RELATED APPLICATIONS

This application is the national phase under 35 U. S. C. §371 of PCT International Application No. PCT/JP2014/064323 which has an International filing date of May 29, 2014 and designated the United States of America.

FIELD

The present invention relates to a liquid crystal panel in which a liquid crystal layer surrounded by a sealing material and two insulating films which insulate a plurality of thin film transistors are arranged between two substrates facing each other and a method of forming a groove in an insulating film, and more particularly, to a liquid crystal panel in which a groove is formed in a part or the whole of an insulating film on the liquid crystal layer side and a method of forming a groove in an insulating film.

BACKGROUND

In recent years, liquid crystal display panels of an active matrix type using switching elements such as thin film transistors (TFTs) have been widely used in display units of devices displaying videos and images. In such display panels, a plurality of TFTs are insulated from each other using an insulating film formed on a substrate, and a data signal and a scan signal are supplied to such TFTs by using data signal lines and scan signal lines that are wired horizontally and vertically.

While the data signal lines and the scan signal lines are insulated from each other so as not to overlap each other by using the insulating film, in a case where the thickness of the insulating film is small, delay of the signals occurs due to parasitic capacitance formed at the intersections of these signal lines, which becomes one factor for the quality degradation of image display using the TFTs.

Thus, in Japanese Patent No. 4916461, an active matrix substrate in which the thickness of a first interlayer insulating film insulating signal wirings (data signal lines) and scan wirings (scan signal lines) from each other is configured to be larger than that of a gate insulating film insulating gate electrodes has been disclosed, and the first interlayer insulating film is described to be appropriately formed, for example, using a spin-on glass (SOG) material.

SUMMARY

However, in a case where a first insulating film insulating the data signal lines and the scan signal lines from each other, for example, by using an SOG material, and a second insulating film that is partly deficient is formed on the liquid crystal layer side, there are cases where a contaminant component included in the outside air or the like passes through the first insulating film and infiltrates into the liquid crystal layer from a deficient portion of the second insulating film so as to cause defective display.

Such a problem is assumed to be caused by a relatively low barrier property for gas and/or liquid of the first insulating film.

The present invention is devised in consideration of such situations, and an object thereof is to provide a liquid crystal panel capable of preventing the infiltration of a contaminant component from the outside into a liquid crystal layer through an insulating film formed on a substrate, and a method of forming a groove in an insulating film.

In a liquid crystal panel according to the present invention including: a first substrate and a second substrate that faces the first substrate; a first insulating film that is formed on a second substrate side of the first substrate; a second insulating film that is formed on a second substrate side of the first insulating film and is formed to include a plurality of films; a liquid crystal layer that is disposed between the second insulating film and the second substrate; a sealing material that surrounds an outer edge portion of the liquid crystal layer; and a plurality of thin film transistors that are insulated by the first and second insulating films, the second insulating film has a groove that is formed at a part or whole of a peripheral edge portion located more inside than a position at which the second insulating film overlaps the sealing material, and has a higher barrier property for gas and/or liquid than the first insulating film at the first insulating film side, and the groove has a bottom formed with the same material as a part of a material for forming the thin film transistor.

In the liquid crystal panel according to the present invention, the first insulating film is formed to contain a spin-on-glass (SOG) material.

In the liquid crystal panel according to the present invention, the second insulating film is configured to include: a gate insulating film formed on the first insulating film side and insulating a gate electrode and a semiconductor layer of the thin film transistor from each other; and a passivation film and/or an organic insulating film formed on the liquid crystal layer side and covering the semiconductor layer and a source electrode of the thin film transistor.

In the liquid crystal panel according to the present invention, the gate insulating film is formed to contain at least one of silicon nitride ($SiN_x$), silicon oxide ($SiO_2$) and silicon oxynitride (SiON).

In the liquid crystal panel according to the present invention, the bottom is formed with the same material as a material for forming the semiconductor layer.

In the liquid crystal panel according to the present invention, the bottom is formed with the same material as a material for forming the source electrode.

A method of forming a groove in an insulating film according to the present invention is to form a groove in an insulating film in a liquid crystal panel including: a first substrate and a second substrate that faces the first substrate; a first insulating film that is formed on the second substrate side of the first substrate; a second insulating film that is formed on the second substrate side of the first insulating film and is formed to include a plurality of films; a liquid crystal layer that is disposed between the second insulating film and the second substrate; a sealing material that surrounds an outer edge portion of the liquid crystal layer; and a plurality of thin film transistors that are insulated by the first and second insulating films, in which the groove is formed on the liquid crystal layer side of the second insulating film, and the method comprises: forming an etching interruption film having a higher etching selectivity ratio than the second insulating film at a position corresponding to a part or whole of a peripheral edge portion located more inside than a position at which the second insulating film overlaps the sealing material in a part of a plurality of processes in which the thin film transistor is formed, and performing a dry etching process on a part or whole of the peripheral edge portion after formation of the second insulating film so as to form the groove from a side which is to face the liquid crystal layer.

According to the present invention, even in a state in which the outer edge portion of the first insulating film formed on the substrate is brought into contact with the outside air, an infiltration path of a contaminant component that is formed from the outside air to the liquid crystal layer through the outer edge portion and the inside of the first insulating film and the groove of the second insulating film is blocked according to a barrier property of the lowermost film of the second insulating film, which is formed below the bottom of the groove.

Accordingly, the infiltration of a contaminant component from the outside to the liquid crystal layer through the insulating film formed on the substrate can be prevented.

The above and further objects and features will more fully be apparent from the following detailed description with accompanying drawings.

DETAILED DESCRIPTION

Hereinafter, embodiments of the present invention will be described in detail with reference to the drawings.

Embodiment 1

Figure 1:
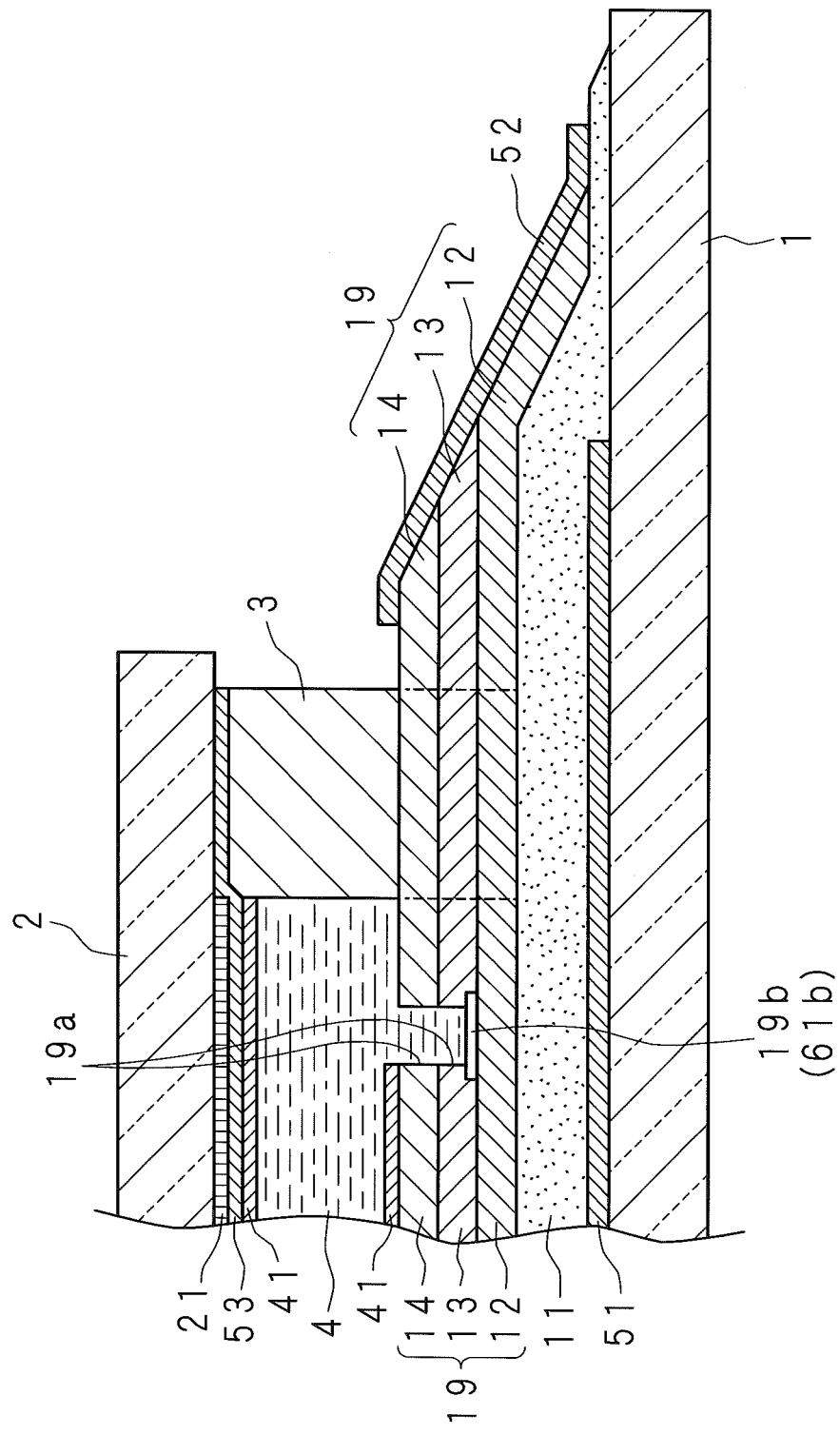
FIG. 1 is a cross-sectional view schematically illustrating the configuration of a liquid crystal panel according to Embodiment 1 of the present invention.

FIG. 1 is a cross-sectional view that schematically illustrates the configuration of a liquid crystal panel according to Embodiment 1 of the present invention. The liquid crystal panel is configured by interposing a liquid crystal layer 4 having an outer edge portion being surrounded by a sealing material 3 between a first glass substrate (corresponding to a first substrate) 1 and a second glass substrate (corresponding to a second substrate) 2 each having a rectangular shape.

On one surface of the first glass substrate 1, which is the liquid crystal layer 4 side, a data signal line 51 used for supplying a data signal to a source electrode of each TFT (corresponding to a thin film transistor), which is not illustrated in the figure, corresponding to each of a plurality of pixels is formed in the horizontal direction in FIG. 1. The data signal line 51, for example, is acquired by patterning a film, which is made of metal such as aluminum, formed using a sputtering method. In addition, on one surface of the first glass substrate 1, a first insulating film 11, which is made from a spin-on glass (SOG) material, having an outer edge portion exposed to the outside air is formed to cover the data signal line 51.

On the first insulating film 11, a gate insulating film 12 made of silicon nitride ($SiN_x$) and a passivation film 13 are formed in this order using, for example, a chemical vapor deposition (CVD) method. The gate insulating film 12 may be formed to contain at least one of silicon nitride, silicon oxide ($SiO_2$), and silicon oxynitride (SiON).

On the passivation film 13, an organic insulating film 14 is formed, for example, by coating the passivation film 13 with an acrylic organic resin material and hardening the organic resin material. In the present Embodiment 1, a second insulating film 19 is configured by the gate insulating film 12, the passivation film 13 and the organic insulating film 14. Formation of films may be skipped for one of the passivation film 13 and the organic insulating film 14.

In a part or the whole of a peripheral edge portion of the second insulating film 19 that is located more inside than a position (an area interposed between two broken lines illustrated in FIG. 1) at which the second insulating film 19 overlaps the sealing material 3, a groove 19a is formed, for example, through a dry etching process. The groove 19a has a bottom 19b formed on the gate insulating film 12. The groove 19a is filled with liquid crystals included in the liquid crystal layer 4. In a part of the outer edge portion of the second insulating film 19, a transparent electrode 52 connected to an opposing electrode 53 to be described later is formed using the sputtering method.

On one surface of the second glass substrate 2 that is the liquid crystal layer 4 side, a color filter 21 is formed in which coloring layers of three colors RGB are formed for each pixel. On the color filter 21, the opposing electrode 53 formed by an indium tin oxide (ITO) film formed using the sputtering method is formed, and this opposing electrode 53 faces a pixel electrode (not illustrated in the figure) formed in correspondence with a pixel on the organic insulating film 14 of the first glass substrate 1 through the liquid crystal layer 4.

On the organic insulating film 14 of the first glass substrate 1 and on the opposing electrode 53 of the second glass substrate 2, alignment films 41 and 41 are formed, for example, by coating using a polyimide resin. In the process of coating the organic insulating film 14 with the polyimide resin, the groove 19a serves as a flow stopper of the polyimide resin, and thus, the alignment film 41 is not formed on a further outer periphery side than the groove 19a.

Next, the configuration of a plurality of TFTs that are insulated from one another by the first insulating film 11 and the second insulating film 19 will be described.

Figure 2:
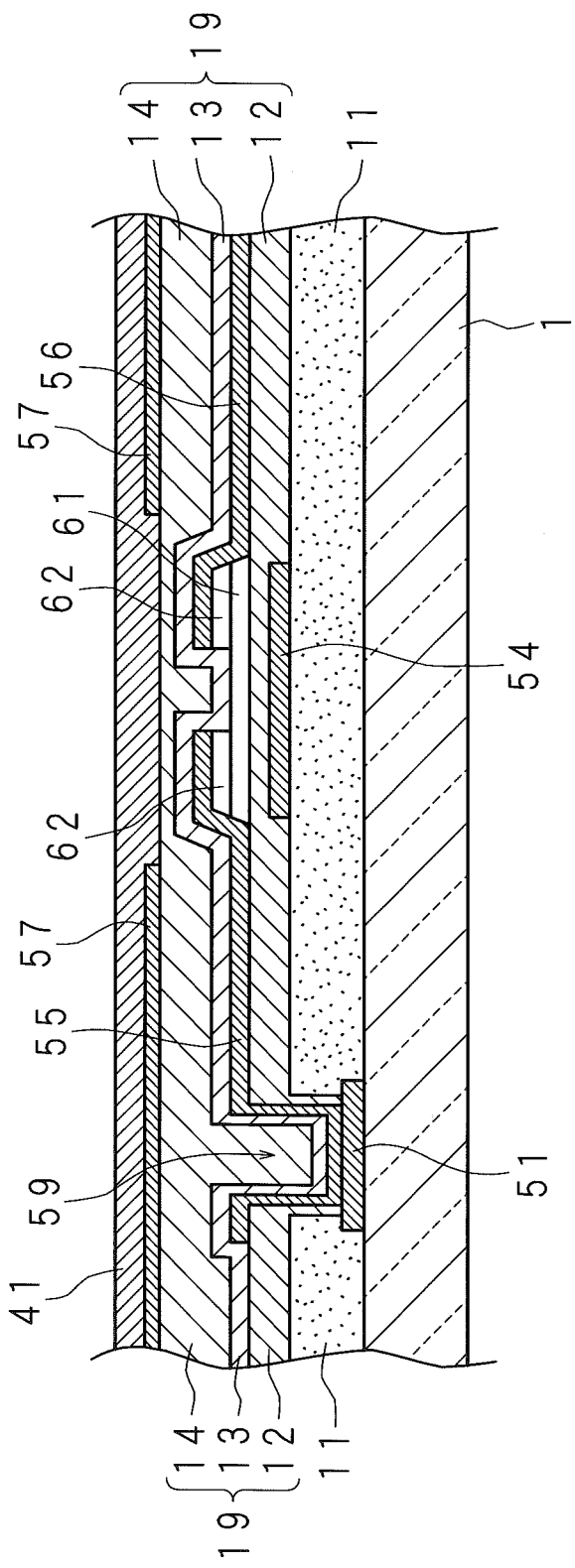
FIG. 2 is a partial cross-sectional view of a liquid crystal panel illustrating a cross section orthogonal to the cross section in FIG. 1.

FIG. 2 is a partial cross-sectional view of a liquid crystal panel illustrating a cross section orthogonal to the cross section in FIG. 1. In FIG. 2, the configurations for one of the plurality of TFTs and the peripheral parts thereof are illustrated. In the first insulating film 11, a contact hole 59 is formed by patterning after formation of the first insulating film 11. On the first insulating film 11, the gate electrode 54 of the TFT is formed by patterning a film made of metal such as aluminum formed by e.g., a sputtering method.

A scan signal line (not illustrated) for supplying a scan signal to the gate electrode 54 is formed in a direction crossing the data signal line 51 in the same process as the process of forming the gate electrode 54. The gate electrode 54 and scan signal line are covered with the gate insulating film 12. The gate insulating film 12 in the contact hole 59 is removed by patterning.

At a position corresponding to the gate electrode 54 on the gate insulating film 12, patterning is performed on a film of amorphous silicon (a-Si) and a film of n+ amorphous silicon (n+a-Si) that are successively formed by e.g., a CVD method, to form the semiconductor layers 61 and 62. In the case where patterning is performed on the semiconductor layers 61 and 62, amorphous silicon in the contact hole 59 is removed. According to the present Embodiment 1, the bottom 19b described above is configured by the interruption film 61b formed from the same material as that of the semiconductor layers 61 and 62 in the same process as the process of forming the semiconductor layers 61 and 62.

On the semiconductor layer 62, a source electrode 55 and a drain electrode 56 are formed by patterning a film made of metal such as aluminum formed by e.g., a sputtering method. The source electrode 55 is connected to the data signal line 51 at the bottom of the contact hole 59. At a position overlapping with a region interposed between the source electrode 55 and drain electrode 56, the semiconductor layer 62 is removed by, e.g. dry etching. The semiconductor layer 61, the source electrode 55 and the drain electrode 56 are covered with the passivation film 13.

The TFT is configured by including the gate electrode 54, the gate insulating film 12, the semiconductor layers 61, 62, the source electrode 55 and the drain electrode 56. At a position not corresponding to the TFT on the organic insulating film 14, a pixel electrode 57 is formed by patterning an ITO film formed by a sputtering method. The pixel electrode 57 is covered with the alignment film 41 and is connected to the drain electrode 56 through the contact hole (not illustrated).

The SOG material described above is a material that can be used for forming a glass film (silica coating film) using a coating method such as a spin coating method or a slit coating method. The SOG material has a low specific dielectric constant and can easily form a thick film. Thus, by increasing the thickness of the first insulating film 11 by using the SOG material, parasitic capacitance formed at intersections of the data signal lines 51 and the scan signal lines, which intersect with each other through the first insulating film 11, can be effectively decreased, and a signal leakage due to a foreign material interposed between the data signal line 51 and the scan signal line can be prevented. In addition, in order to alleviate the generation of byproducts (dusts) when the first insulating film 11 formed by using the SOG material is processed through dry etching, the first insulating film 11 is formed up to the peripheral edge portion of the first glass substrate 1, and the etching area is decreased.

The first insulating film 11 is formed by baking the SOG material that is solved into a solvent and is used for the coating. In contrast to this, according to the CVD method forming the gate insulating film 12 and the passivation film 13, a silicon-based film material is supplied in a gas phase, and a film is formed through a chemical reaction of the surface of the base material in the gas phase. For this reason, generally, a film formed by using a silicon compound formed using the CVD method is denser than a film formed using the SOG material and has a superior barrier property for gas and/or liquid (for example, a gas barrier property, a steam barrier property, a barrier property for ions solved into water, and the like).

As for an etching method such as dry etching used in the process of forming the groove 19a, the etching selectivity ratio is higher for amorphous silicon contained in the semiconductor layers 61 and 62 of the TFT than for the silicon compound and organic resin material contained in the second insulating film 19. Thus, by forming the interruption film 61b at a position to be the bottom 19b of the groove 19a with the same material as that of the semiconductor layers 61 and 62 by the same process as the process of forming the semiconductor layers 61 and 62 of the TFT, etching, which is performed at the position where the groove 19a is to be formed, is interrupted by the interruption film 61b, and the groove 19a having the bottom 19b is formed.

In the configuration described above, if the second insulating film 19 is pierced due to etching for forming the groove 19a while the interruption film 61b is not formed, there is concern that infiltration of a certain contaminant component occurs through a path formed from the outer edge portion of the first insulating film 11 exposed to the outside air to the liquid crystal layer 4, through the inside of the film and the groove 19a. In the present Embodiment 1, as the etching is interrupted at the bottom 19b made of the interruption film 61b and thus the gate insulating film 12 remains, the path described above is blocked according to the barrier property for gas and/or liquid of the gate insulating film 12 that is left below the bottom 19b.

As above, according to the present Embodiment 1, the liquid crystal layer 4 is disposed on the second glass substrate 2 side between the first glass substrate 1 and the second glass substrate 2, the first insulating film 11 and the second insulating film 19 including a plurality of films are formed in this order on the surface of the first glass substrate 1 that is disposed on the liquid crystal layer 4 side, the outer edge portion of the liquid crystal layer 4 is surrounded by the sealing material 3, and a plurality of TFTs (thin film transistors) are insulated from each other by the first insulating film 11 and the second insulating film 19. The gate insulating film 12 included in the second insulating film 19 is so formed as to have a higher barrier property for gas and/or liquid than the first insulating film 11, while the groove 19a is formed at a part or the whole of the peripheral edge portion of the second insulating film 19 located more inside than the position where the second insulating film 19 overlaps the sealing material 3, the groove 19a having the bottom 19b formed with the same material as that of a part of the TFT by the same process as the process of forming the TFT. This groove 19a serves as a flow stopper when the material of the alignment film 41 is applied on the second insulating film 19.

Accordingly, even in a state in which the outer edge portion of the first insulating film 11 formed on the first glass substrate 1 is brought into contact with the outside air, the infiltration path of a contaminant component that is formed from the outside air to the liquid crystal layer 4, through the outer edge portion and the inside of the first insulating film 11 as well as the gate insulating film 12 and the bottom 19b of the groove 19a, is blocked according to the barrier property of the gate insulating film 12 formed below the bottom 19b of the groove 19a.

Accordingly, the infiltration of a contaminant component to the liquid crystal layer 4 from the outside through the insulating film formed on the substrate can be prevented.

Prior to the process of forming the groove 19a in the second insulating film 19 including a plurality of films, at a part of the plurality of processes where the TFT is formed, an interruption film 61b having a higher etching selectivity ratio than the second insulating film 19 is formed at a position corresponding to a part or the whole of the peripheral edge portion of the second insulating film 19 located more inside than the position where the second insulating film 19 overlaps the sealing material 3, and a dry etching process is performed after the formation of the second insulating film 19 so as to form the groove 19a at a part or the whole of the peripheral edge portion. In this case, as the material for the second insulating film 19 has an etching selectivity ratio different from that of the material for the interruption film 61b, dry etching is interrupted by the interruption film 61b.

It is therefore possible to form the groove 19a with the interruption film 61b serving as the bottom 19b in the state where a part of the second insulating film 19 remains below the interruption film 61b.

Furthermore, at the same process as the process of forming the semiconductor layers 61 and 62 of the TFT, the interruption film 61b which is to serve as the bottom 19b of the groove 19a of the second insulating film 19 is formed with the same material as that of the semiconductor layers 61 and 62.

It is therefore possible to leave the gate insulating film 12 when forming the groove 19a owing to the interruption film 61b formed with the same material as that of the semiconductor layers 61 and 62 without any particular additional process.

Embodiment 2

While Embodiment 1 has a form in which the interruption film 61b serving as the bottom 19b of the groove 19a is formed with the same material as the material of the semiconductor layers 61 and 62, Embodiment 2 has a form in which an interruption film 55b is formed with the same material as the material of the source electrode 55 of the TFT.

Figure 3:
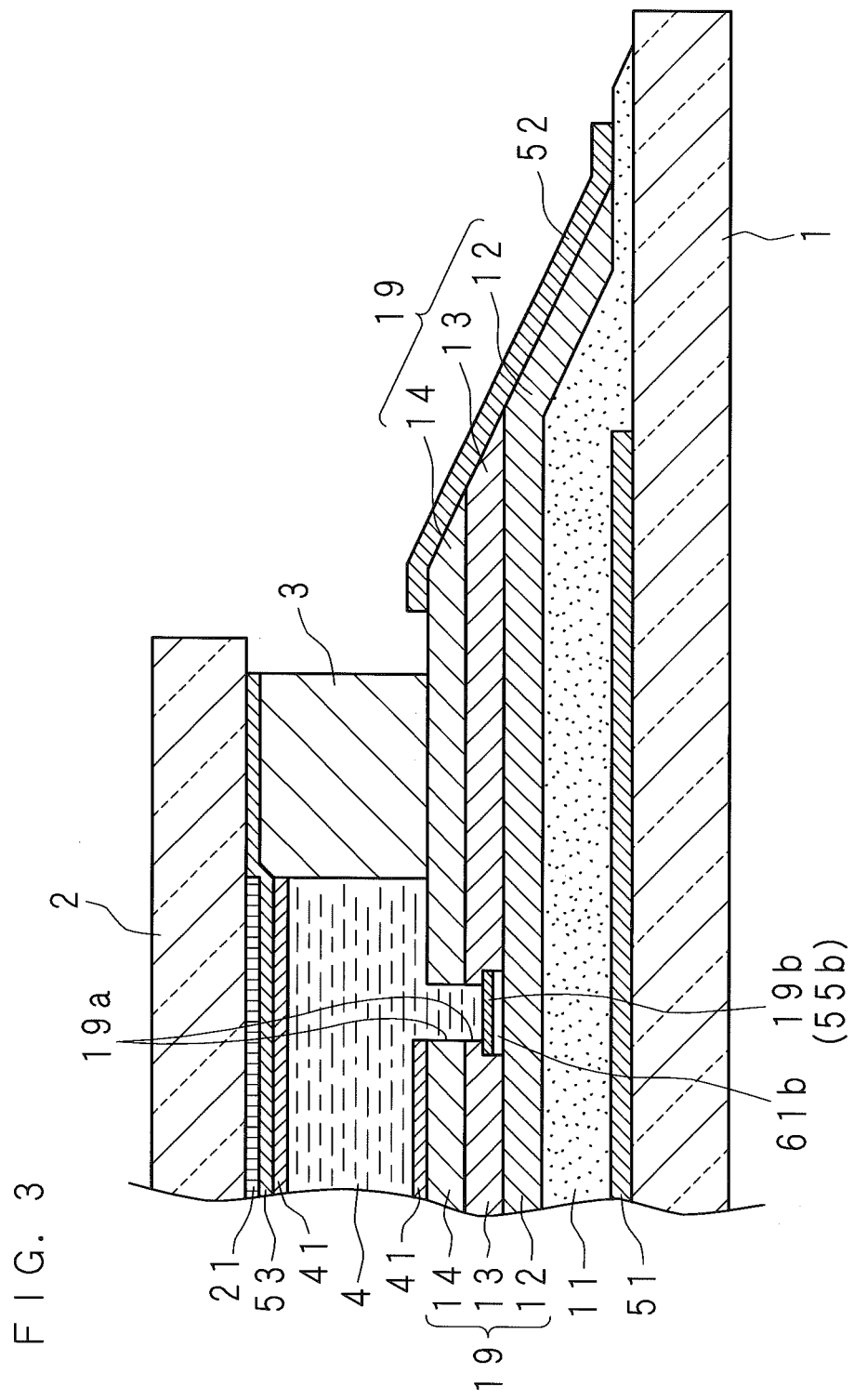
FIG. 3 is a cross-sectional view schematically illustrating the configuration of a liquid crystal panel according to Embodiment 2 of the present invention.

FIG. 3 is a cross-sectional view that schematically illustrates the configuration of a liquid crystal panel according to Embodiment 2 of the present invention.

On the interruption film 61b formed by the same process as the process of forming the semiconductor layers 61 and 62, an interruption film 55b is formed by the same process as the process of forming the source electrode 55. The interruption film 55b is made of the same metal material as that of the source electrode 55. The interruption film 55b may also be formed on the gate insulating film 12 without formation of the interruption film 61b.

As for the etching method such as dry etching used in the process of forming the groove 19a, generally, the etching selective ratio is higher for the metal contained in each electrode of the TFT compared to that for the silicon compound and organic resin material contained in the second insulating film 19. Thus, by forming the interruption film 55b with the same material as that of the source electrode 55 at a position of the groove 19a which is to serve as the bottom 19b through the same process as the process of forming the source electrode 55 of the TFT, etching which is performed on the position where the groove 19a is to be formed is interrupted by the interruption film 55b, and the groove 19a with the bottom 19b being the interruption film 55b is formed.

Other than that, the same reference numeral is assigned to a portion corresponding to that of Embodiment 1, and detailed description thereof will not be presented.

As described above, according to the present Embodiment 2, the interruption film 55b which is to serve as the bottom 19b of the groove 19a of the second insulating film 19 is formed with the same material as that of the source electrode 55 through the same process as the process for forming the source electrode 55 of the TFT.

It is therefore possible to leave the gate insulating film 12 at forming of the groove 19a by the interruption film 55b formed with the same material as the material of the source electrode 55 without any particular additional process.

Embodiment 3

While Embodiment 1 has a form in which the interruption film 61b formed on the gate insulating film 12 interrupts dry etching, Embodiment 3 has a form in which the interruption film 61b is removed by dry etching.

Figure 4:
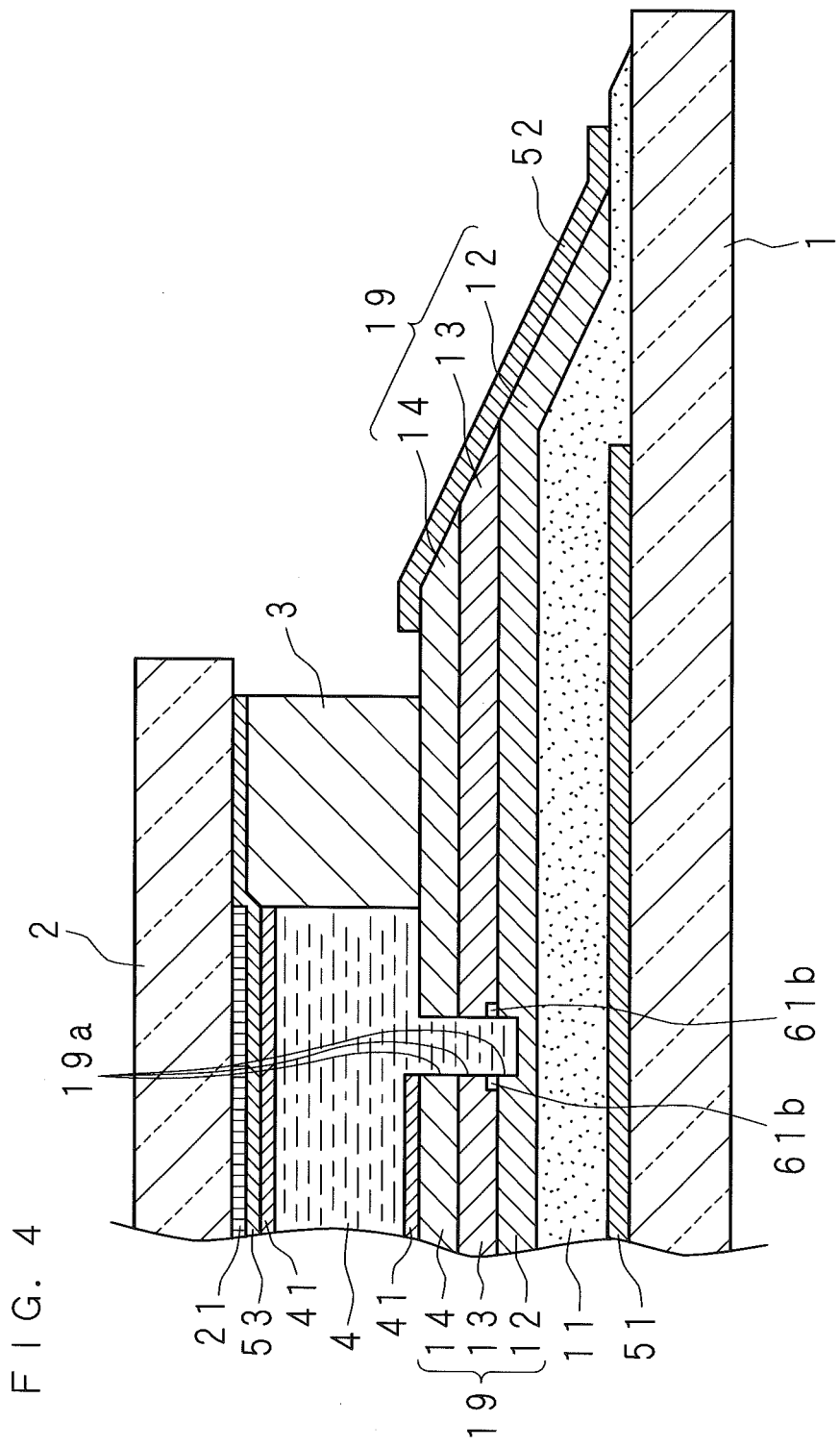
FIG. 4 is a cross-sectional view schematically illustrating the configuration of a liquid crystal panel according to Embodiment 3 of the present invention.

FIG. 4 is a cross-sectional view schematically illustrating the configuration of a liquid crystal panel according to Embodiment 3 of the present invention.

There may be a case where etching excessively progresses when the groove 19a is formed by dry etching, which may pierce the interruption film 61b as illustrated in FIG. 4. It is, however, possible to prevent the gate insulating film 12 from being pierced, since the interruption film 61b temporarily interrupts the dry etching to retard the progress of etching. Thus remaining gate insulating film 12 interrupts the infiltration of a contaminant component to the liquid crystal layer 4.

As described above, according to Embodiment 3, even though the interruption film 61b is removed and even in a state where the outer edge portion of the first insulating film 11 is brought into contact with the outside air, an infiltration path of a contaminant component that is formed from the outside air to the liquid crystal layer 4 through the outer edge portion and the inside of the first insulating film 11 and the groove 19a of the second insulating film 19 may be blocked according to a barrier property of the gate insulating film 12 remaining below the groove 19a.

Furthermore, according to Embodiments 1 to 3, the first insulating film 11 is formed by containing SOG material which may easily form a thick film at a low dielectric constant.

Accordingly, the leakage current between the data signal line 51 and the scan signal line can be decreased. In addition, with the gate insulating film 12 formed below the groove 19a, even though a contaminant component can easily infiltrate into the inside through the first insulating film 11, the infiltration path of a contaminant component from the outside to the liquid crystal layer 4 can be blocked.

Furthermore, according to Embodiments 1 to 3, the gate insulating film 12 which insulates the gate electrode 54 of the TFT from the semiconductor layer 61 is formed on the first insulating film 11 side of the second insulating film 19, while the passivation film 13 and/or the organic insulating film 14 covering the semiconductor layer 61, the source electrode 55 and the drain electrode 56 of the TFT are formed at the liquid crystal layer 4 side of the second insulating film 19.

Accordingly, the portion of the TFT excluding the gate electrode 54 may be insulated from another circuit by at least one of the gate insulating film 12, the passivation film 13 and the organic insulating film 14. Furthermore, in the case where the thickness of the gate insulating film 12 is formed to be thin, the current driving ability of the TFT from the scan signal applied to the gate electrode 54 may be enhanced.

In addition, according to Embodiments 1 to 3, the gate insulating film 12 is formed with a general process by, for example, the CVD method, and is a precise film containing at least one of silicon nitride, silicon oxide ($SiO_2$) and silicon oxynitride (SiON).

Therefore, by the gate insulating film 12 formed below the groove 19a, the infiltration path of a contamination component from the outside to the liquid crystal layer 4 may reliably be blocked.

While a data signal is supplied to the source electrode 55 of the TFT in Embodiments 1 to 3, a data signal may also be supplied to the drain electrode 56 of the TFT, and the source electrode 55 may be connected to the pixel electrode 57.

Moreover, while the TFT is a so-called bottom gate type (inverted staggered type), it may alternatively be a staggered type.

It is noted that, as used herein and in the appended claims, the singular forms "a", "an", and "the" include plural referents unless the context clearly dictates otherwise.

The embodiments disclosed here should be considered to be exemplary in every aspect but not to be limited. The scope of the present invention is intended to include all the changes within a meaning and a range equivalent to the scope of the claims other than the meaning described above. In addition, the technical features described in the embodiments can be combined together.

The invention claimed is:

1. A liquid crystal panel, comprising:
    a first substrate and a second substrate that faces the first substrate;
    a first insulating film that is formed on a second substrate side of the first substrate;
    a second insulating film that is formed on the second substrate side of the first insulating film and is formed to include a plurality of films;
    a liquid crystal layer that is disposed between the second insulating film and the second substrate;
    a sealing material that surrounds an outer edge portion of the liquid crystal layer; and
    a plurality of thin film transistors that are insulated by the first and second insulating films,
    wherein the second insulating film has a groove that is formed at a part or whole of a peripheral edge portion located more inside than a position at which the second insulating film overlaps the sealing material, and has a higher barrier property for gas and/or liquid than the first insulating film at the first insulating film side, and
    wherein the groove has a bottom formed with the same semiconductor material as a part of a material for forming the thin film transistor.

2. The liquid crystal panel according to claim 1, wherein the first insulating film is formed to contain a spin-on-glass (SOG) material.

3. A liquid crystal panel, comprising:
    a first substrate and a second substrate that faces the first substrate;
    a first insulating film that is formed on a second substrate side of the first substrate;
    a second insulating film that is formed on the second substrate side of the first insulating film and is formed to include a plurality of films;
    a liquid crystal layer that is disposed between the second insulating film and the second substrate;
    a sealing material that surrounds an outer edge portion of the liquid crystal layer; and
    a plurality of thin film transistors that are insulated by the first and second insulating films,
    wherein the second insulating film has a groove that is formed at a part or whole of a peripheral edge portion located more inside than a position at which the second insulating film overlaps the sealing material, and has a higher barrier property for gas and/or liquid than the first insulating film at the first insulating film side, and
    wherein the groove has a bottom formed with the same material as a part of a material for forming the thin film transistor,
    wherein the second insulating film is configured to include:
    a gate insulating film formed on the first insulating film side and insulating a gate electrode and a semiconductor layer of the thin film transistor from each other; and
    a passivation film and/or an organic insulating film formed on the liquid crystal layer side and covering the semiconductor layer and a source electrode of the thin film transistor.

4. The liquid crystal panel according to claim 3, wherein the gate insulating film is formed to contain at least one of silicon nitride ($SiN_x$), silicon oxide ($SiO_2$) and silicon oxynitride (SiON).

5. The liquid crystal panel according to claim 3, wherein the bottom is formed with the same material as a material for forming the semiconductor layer.

6. The liquid crystal panel according to claim 3, wherein the bottom is formed with the same material as a material for forming the source electrode.

7. A method of forming a groove in an insulating film in a liquid crystal panel comprising: a first substrate and a second substrate that faces the first substrate; a first insulating film that is formed on the second substrate side of the first substrate; a second insulating film that is formed on the second substrate side of the first insulating film and is formed to include a plurality of films; a liquid crystal layer that is disposed between the second insulating film and the second substrate; a sealing material that surrounds an outer edge portion of the liquid crystal layer; and a plurality of thin film transistors that are insulated by the first and second insulating films, in which the groove is formed on the liquid crystal layer side of the second insulating film, the method comprising:
    forming an etching interruption film of a semiconductor layer having a higher etching selectivity ratio than the second insulating film at a position corresponding to a part or whole of a peripheral edge portion located more inside than a position at which the second insulating film overlaps the sealing material in a part of a plurality of processes in which the thin film transistor is formed, and
    performing a dry etching process on a part or whole of the peripheral edge portion after formation of the second insulating film so as to form the groove from a side which is to face the liquid crystal layer.

* * * * *